United States Patent
Faust et al.

(10) Patent No.: US 10,254,759 B1
(45) Date of Patent: Apr. 9, 2019

(54) INTERACTIVE AUTONOMOUS VEHICLE AGENT

(71) Applicant: Waymo LLC, Mountain View, CA (US)

(72) Inventors: Aleksandra Faust, Palo Alto, CA (US); Matthieu Devin, Los Altos Hills, CA (US); Yu-hsin Joyce Chen, Sunnyvale, CA (US); Franklin Morley, East Palo Alto, CA (US); Vadim Furman, Los Gatos, CA (US); Carlos Alberto Fuertes Pascual, Mountain View, CA (US)

(73) Assignee: Waymo LLC, Mountain View, CA (US)

( * ) Notice: Subject to any disclaimer, the term of this patent is extended or adjusted under 35 U.S.C. 154(b) by 7 days.

(21) Appl. No.: 15/704,969

(22) Filed: Sep. 14, 2017

(51) Int. Cl.
  *G05D 1/00* (2006.01)
  *G05B 13/02* (2006.01)
(52) U.S. Cl.
  CPC ......... *G05D 1/0088* (2013.01); *G05B 13/027* (2013.01)
(58) Field of Classification Search
  CPC ............................ G05D 1/0088; G05B 13/027
  USPC .......................................................... 701/27
  See application file for complete search history.

(56) References Cited

U.S. PATENT DOCUMENTS

| 2017/0024643 A1* | 1/2017 | Lillicrap | G06N 3/0454 |
| 2017/0076201 A1* | 3/2017 | van Hasselt | G06N 3/08 |
| 2017/0228662 A1* | 8/2017 | Gu | G06N 3/0427 |
| 2018/0032082 A1* | 2/2018 | Shalev-Shwartz | B60W 30/0953 |
| 2018/0237005 A1* | 8/2018 | Duan | B60W 30/09 |

OTHER PUBLICATIONS

Abbeel et al. "Apprenticeship Learning via Inverse Reinforcement Learning," Proceedings of the twenty-first international conference on Machine learning, ACM, Jul. 2004, 8 pages.
(Continued)

*Primary Examiner* — Brian P Sweeney
(74) *Attorney, Agent, or Firm* — Fish & Richardson P.C.

(57) ABSTRACT

Methods, systems, and apparatus, including computer programs encoded on computer storage media, for implementing an interactive autonomous vehicle agent. One of the methods includes receiving a request to generate an experience tuple for a vehicle in a particular driving context. A predicted environment observation representing a predicted environment of the autonomous vehicle after the candidate action is taken by the autonomous vehicle in an initial environment is generated, including providing an initial environment observation and the candidate action as input to a vehicle behavior model neural network trained to generate predicted environment observations. An immediate quality value is generated from a context-specific quality model that generates immediate quality values that are specific to the particular driving context. An experience tuple comprising the initial environment observation, the candidate action, and the immediate quality value is generated and used as input to a reinforcement learning system for the autonomous vehicle.

21 Claims, 4 Drawing Sheets

(56) References Cited

OTHER PUBLICATIONS

Abbeel. "Inverse Reinforcement Learning," Encyclopedia or machine learning, Springer US, 2011, 75 pages.
Mnih et al. "Playing Atari with Deep Reinforcement Learning," arXiv preprint arXiv 1312.5602, Dec. 19, 2013, 9 pages.
Syed et al. "A Game-Theoretic Approach to Apprenticeship Learning," Advances in neural information processing systems, 2008, 8 pages.

\* cited by examiner

INTERACTIVE AUTONOMOUS VEHICLE AGENT

BACKGROUND

This specification relates to autonomous vehicles.

Autonomous vehicles include self-driving cars, boats, and aircraft. Autonomous vehicles use a variety of on-board sensors and computer systems to detect nearby objects and use such detections to make control and navigation decisions.

Some autonomous vehicles have computer systems that implement neural networks for various planning and detection tasks. Neural networks, or for brevity, networks, are machine learning models that employ multiple layers of operations to predict one or more outputs from one or more inputs. Neural networks typically include one or more hidden layers situated between an input layer and an output layer. The output of each layer is used as input to another layer in the network, e.g., the next hidden layer or the output layer. As an example, a neural network can be used to determine that an image captured by an on-board camera is likely to contain an image of a nearby car.

Reinforcement learning is an area of machine learning that involves training software agents to interact with an environment. Agents receive observations that each characterize the current state of the environment, and in response, perform actions that are designed to maximize a cumulative reward. Some reinforcement learning agents use neural networks to select the action to be performed in response to receiving a given observation.

SUMMARY

This specification describes how to use reinforcement learning to train an interactive agent for autonomous vehicles. In this specification, an interactive agent is a software program that takes, as input, a current representation of a driving environment, either real or simulated, and generates a corresponding action to be taken by the interactive agent in the real or simulated driving environment. An interactive agent trained using the techniques described below can be used to drive a simulated vehicle in autonomous vehicle simulations or on board a physical autonomous vehicle to dictate or to help make planning and control decisions.

Particular embodiments of the subject matter described in this specification can be implemented so as to realize one or more of the following advantages. Using a general purpose vehicle behavior model with a context-specific quality model allows the control of autonomous vehicles to be informed by reinforcement learning techniques. This provides for more natural and human-like control of the vehicle. The architecture of the system allows the system to efficiently generate a sufficient number of reliable and realistic experience tuples in a reasonable amount of time for many different driving contexts. This is in part because the separation between the quality model and the vehicle behavior model allows the vehicle behavior model to be trained with automatically generated training data, which drastically reduces the amount of human-labeled data that must be collected and, in turn, reduces the amount of time required to build and train the system. The agent can be trained using simulations and then, once trained, the learned policies can be deployed on an actual physical vehicle. This can greatly improve the safety of learning driving maneuvers without putting a physical vehicle or humans at risk, which is particularly useful for learning to drive in dangerous situations or environments. The trained agents can also be used to enhance the realism of scenario tests for core autonomous vehicle software by including the trained agents as other actors in the simulation. While some models may be unfit for use in an actual autonomous vehicle, their learned behaviors applied in simulation can still be valuable in preparing the core software to face adverse and highly diverse driving conditions that may not have been observed, even after millions of miles of real-world driving.

The details of one or more embodiments of the subject matter of this specification are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1:
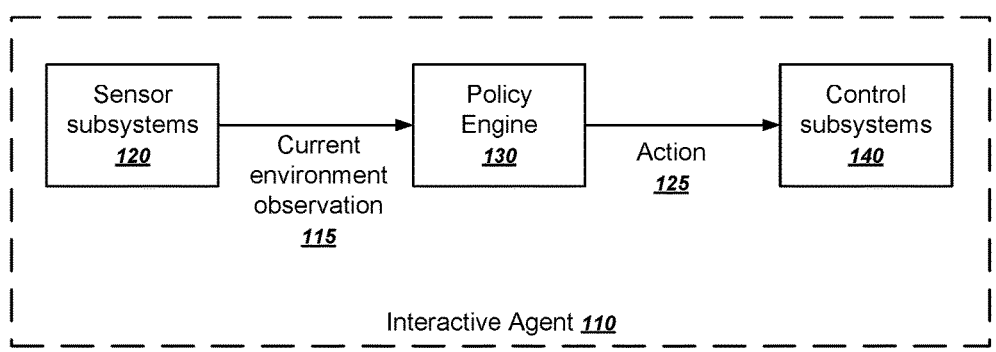
FIG. 1 is a diagram that illustrates components of an example interactive agent.

FIG. 1 is a diagram that illustrates components of an example interactive agent 110. The interactive agent 110 includes sensor subsystems 120, a policy engine 130, and control subsystems 140.

On a physical vehicle, the sensor subsystems 120 can include actual physical components for detecting nearby objects. For example, the sensor subsystems 120 can include a combination of components that receive reflections of electromagnetic radiation, e.g., lidar systems that detect reflections of laser light, radar systems that detect reflections of radio waves, and camera systems that detect reflections of visible light. For a simulated agent, the sensor subsystems 120 can also be simulated and can generate detection data based on the environment of the simulation.

Whether physical or simulated, the sensor subsystems 120 generate a current environment observation 115 of the driving environment. The current environment observation 115 can represent the layout of streets or roads on which the interactive agent is traveling as well as information about the position, heading, and velocity of nearby vehicles and other objects.

A policy engine 130 receives the current environment observation 115 and generates an action 125. The action 125 represents one or more aspects of vehicle control, e.g., steering left or right at a particular angle, increasing or decreasing throttle, and increasing or decreasing braking.

The policy engine 130 can be trained to generate an action 125 that is designed to maximize the quality of the agent's long-term interaction with the environment. In this specification, the metric that quantifies the quality of the agent's long-term interaction with the environment will be referred to as the cumulative action score. For example, when performing a lane merge, successfully merging lanes while maintaining a safe distance from all other vehicles at all times can be considered to be a high-quality interaction with the environment. As another example, navigating an intersection with four-way stop signs will carry other definitions of a high-quality interaction in the environment. Computing a measure of quality for an interaction in a particular driving context is described in more detail below.

What is considered a quality interaction with the environment is highly dependent upon the driving context of the environment. In this specification, a driving context is a particular driving situation. Typically each driving context is a common and generalizable driving situation. Example driving contexts include lane merges, intersection navigations, lane changes, and high-speed highway driving, to name just a few examples. Each driving context is typically also a short driving interaction, meaning that an autonomous vehicle can navigate the driving situation in a length of time that is on the order of seconds rather than minutes, hours, or days.

A system can maintain a mapping between different geographic areas or navigation routes and a particular driving context for that area. The policy engine 130 can then select a particular driving context according to the location or route of the vehicle. The system can use a separate collection of training data for each different driving context. Training data for a particular driving context can be collected from real-world or simulated driving interactions in geographic areas or routes that are assigned to the particular driving context. Using training data to compute a measure of quality in a particular driving context is described in more detail below.

The policy engine 130 can thus implement one or more trained policies, one for each of a plurality of different driving contexts. Each policy implements a state value function of a reinforcement learning model that defines a mapping between an environment observation and one or more corresponding actions, with each action having a cumulative action score. The policy engine 130 can then select the action 125 based on the cumulative action scores and provide the selected action to the control subsystems 140. This is described in more detail below with reference to FIG. 4. For situations where no policy has been trained or no driving context is defined, the policy engine 130 can fall back to a nominal policy, which can be a heuristics-driven policy rather than a fully machine-learned policy The control subsystems 140 receive the action 125 and apply the action 125 to the controls of the interactive agent 110. In other words, the physical or simulated vehicle can apply the action 125 by adjusting the steering, throttle, or braking of the vehicle, or some combination of these.

In order to provide real-time control of the interactive agent 110 in the driving environment, the interactive agent 110 typically performs the data flow illustrated in FIG. 1 repeatedly as the agent 110 interacts with the environment. The repeat rate is typically on the order of many times per second, e.g., 5, 10, 50, or 100 times per second.

Figure 2:
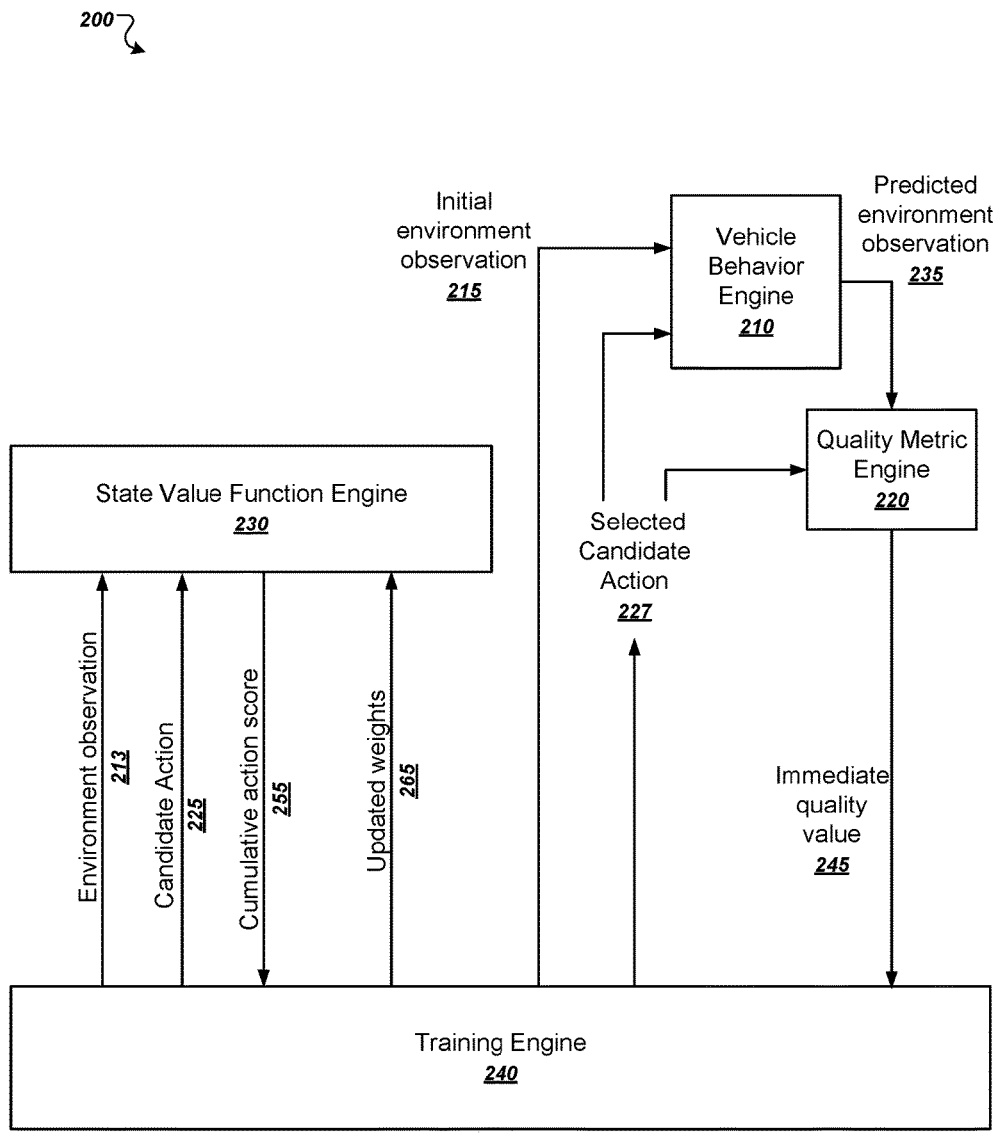
FIG. 2 is a diagram that illustrates the architecture of an example system for training an interactive agent.

FIG. 2 is a diagram that illustrates the architecture of an example system 200 for training an interactive agent. The system 200 includes the following functional components: a vehicle behavior engine 210, a quality metric engine 220, a state value function engine 230, and a training engine 240. These components can be implemented as computer programs installed on one or more computers in one or more locations.

The architecture of the system 200 addresses the intractability and ambiguity problems typically encountered when attempting to use reinforcement learning in the highly complex and dynamic environment that autonomous vehicles operate in. The architecture of the system 200 allows a system to efficiently generate a sufficient number of reliable and realistic experience tuples in a reasonable amount of time for many different driving contexts.

In general, a reinforcement learning process can include two stages: (i) an acting stage that generates experience tuples, and (ii) a training stage that updates reinforcement model using the generated experience tuples. These stages can be coupled, meaning that each experience tuple is used to update the model as soon as it is generated, or decoupled meaning that multiple experience tuples are generated before the model is updated.

During the acting stage, a training engine 240 can generate an experience tuple for a given environment observation 213. To do so, the training engine can provide each of one or more candidate actions 225 and the environment observation 213 to the state value function engine 230. The state value function engine 230 is a machine-learning system that implements a reinforcement model.

The state value function engine 230 receives the candidate action 225 and environment observation 213 and generates a respective cumulative action score 255 for each candidate action 225 when the candidate action is performed in the environment characterized by the environment observation 213.

The training engine 240 can then select the best candidate action run an initial environment observation 215 and selected candidate action 227 through the system 200 to generate an immediate quality value 245. As part of this process, the system also generates a predicted environment observation 235.

The training engine 240 can then generate an experience tuple using (i) the initial environment observation 215, (ii) the selected candidate action 227, (iii) the immediate quality value 245 resulting from applying the selected candidate action 227 in the environment of the initial observation, and (iv) the predicted environment observation 235 after applying the selected candidate action 227 in the environment of the initial observation.

During the training stage, the training engine 240 can obtain a previously generated experience tuple and use the tuple to update weights of the state value function engine 230. To do so, the training engine 240 can provide the initial environment observation 215 and the candidate action 225 of the experience tuple to the state value function engine 230 to generate a cumulative action score 255 for the candidate action 225.

The training engine 240 can then compute a target cumulative action score that should have been generated by the state value function engine 230. To do so, the training engine can use the immediate quality value of the experience tuple and the predicted observation of the experience tuple. In some implementations, the target cumulative score is computed by adding to the immediately quality value a discounted estimate for the highest quality score that could be obtained for any candidate action. Suitable techniques for computing a target cumulative action score include using a Deep Q Network algorithm or Double Deep Q Network algorithm.

The training engine 240 can then compute weight updates 265 for the reinforcement model that adjust the actual cumulative action score 255 toward the computed target cumulative action score, e.g., using gradient descent, and can update the state value function engine 230 using the computed weight updates 265.

The system can use the trained reinforcement model as a policy in a policy engine in order to make simulated or real-world driving decisions for particular driving contexts. In some implementations, the trained reinforcement model is used to augment a baseline nominal policy that uses human-engineered heuristics to determine driving decisions. In other words, when a trained policy is not available for a particular environment or driving context, the system can fall back to the nominal policy.

In more detail, the vehicle behavior engine 210 is a machine-learning system that generates predictions about how taking a particular action affects the behavior of other actors in the environment, e.g., nearby vehicles, pedestrians, bicyclists, or other moving objects. For example, swerving toward another vehicle tends to cause the other vehicle to swerve away. And braking in front of another vehicle tends to cause the other vehicle to also apply the brakes.

The vehicle behavior engine 210 thus models how an initial environment observation changes in response to the agent taking some action in the initial environment. In this context, each environment observation can represent the state of each actor in the environment using, e.g., data representing a type of the actor, a position, an orientation, and a velocity of the actor, and optionally, a stochastic factor that introduces some level of uncertainty in these components.

Therefore, the vehicle behavior engine 210 receives an initial environment observation 215 and a candidate action 225 and generates a predicted environment observation 235. The predicted environment observations 235 can be in any appropriate format. But in general, the predicted environment observations 235 can be in a format that matches the format of the initial environment observations 215. For example, the predicted environment observations 235 can include images of the predicted environment; projections of the predicted environment, e.g., a top-down project or a projection of the contours or surfaces of objects; lower dimensional data, e.g., positions and velocities of actors in the environment; or some combination of these.

The predicted environment observation 235 can be a single representation of an environment or a probability distribution over all outcomes that can be reasonably expected. For example, applying the brakes does not invariably cause a trailing vehicle to also apply its brakes. In the real world, distracted drivers may not react, a phenomenon that can be represented with some measurable probability.

The vehicle behavior engine 210 can implement one or more neural networks for generating predicted environment observations 235. For example, the vehicle behavior engine 210 can train a video pixel network, which generates a prediction of a next video frame for one or more images taken by or generated by the vehicle; a recurrent neural network, or any other appropriate neural network.

The reactions of other vehicles are typically sufficiently generalizable in all driving contexts such that the system can implement a single vehicle behavior engine 210 that predicts vehicle reactions in all driving contexts. Training data for training the vehicle behavior engine 210 thus includes data representing an initial driving environment, an action, and a resulting driving environment. Such training data can be readily collected in large quantities from actual autonomous vehicle experiences in the real world. The training data can include an initial environment observation, an action taken by the autonomous vehicle or another nearby vehicle, and a resulting environment observation. The training engine 240 or another system can then train the vehicle behavior engine 210 on the collected training data using conventional supervised learning techniques.

The quality metric engine 220 is a subsystem that generates immediate quality values 245 for a given candidate action 225 in a particular environment. In the example system 200, the environment happens to be the environment characterized by the predicted environment observation 235 generated by the vehicle behavior engine 210. The quality metric engine 210 can generate the immediate quality values 245 using a machine-learned model, e.g., inverse reinforcement learning; a heuristic; or some combination of these.

As described above, the actions that are considered to be high-quality actions differ substantially in different driving contexts. Therefore, the quality metric engine 220 can be configured to generate different measures of quality for each of an enumerated number of driving contexts.

The quality metric engine 220 can take into account a variety of features that represent different aspects of an interaction in the particular driving context. For example, safety is an important aspect of any high-quality interaction in an autonomous vehicle. Therefore, the quality metric engine 220 can use a safety feature that quantifies the level of safety of the candidate action 225 in the predicted environment 235. As another example, rider comfort can be another important aspect of high-quality driving interactions. Therefore, the quality metric engine 220 can use a comfort feature that quantifies the level of driver comfort for the candidate action 225 in the predicted environment 235.

Values for these features can all be specified through labeled training data collected for the corresponding driving context. The system can obtain the training data from real-world interactions of vehicles in the particular driving context. Each item of training data can include data representing the trajectory of a vehicle within the particular driving context and respective values for one or more features of the interaction.

The quality metric engine 220 can also use a feature that represents a predicted collision distance. The collision distance measures the risk that the agent is about to experience an imminent collision with another vehicle or object. The collision distance roughly represents the sum total of controls that the agent and other vehicles would need to employ to cause a collision. For example, when a vehicle is driving in isolation on the highway, the collision distance is high because the agent or another vehicle would need to initiate fairly drastic controls to cause a collision. On the other hand, when the vehicle is approaching an unmarked intersection, the collision distance might be low because it might be the case that no control inputs at all are required to cause a collision that is already inevitable.

Figure 3:
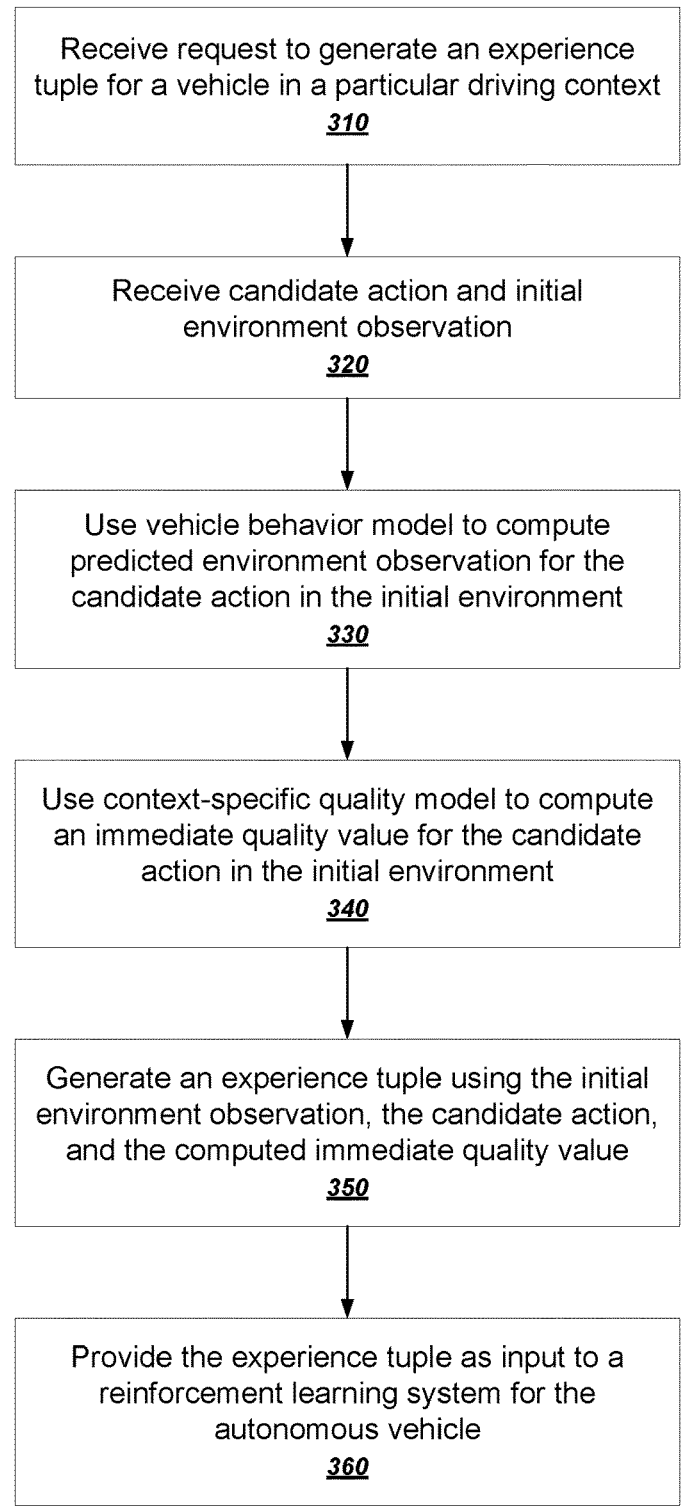
FIG. 3 is a flow chart of an example process for generating an experience tuple for an interactive autonomous vehicle agent in a particular driving context.

FIG. 3 is a flow chart of an example process for generating an experience tuple for an interactive autonomous vehicle agent in a particular driving context. For convenience, the example process will be described as being performed by a system of one or more computers located in one or more locations. For example, the system 200 of FIG. 2, appropriately programmed in accordance with this specification, can perform the example process.

The system receives a request to generate an experience tuple for a vehicle in a particular driving context (310). The system can receive the request as part of a training process in which a policy is being trained or as part of a production process using a trained policy.

As described above, the experience tuple will have an immediate quality value that depends upon the particular driving context. The system can thus select an appropriate driving context given the current location of the vehicle. For example, the system can maintain a mapping between geographic areas or navigation routes and corresponding driving contexts. Then, when the vehicle enters a particular geographic area or travels along a particular route, the system can select the appropriate driving context for generating the experience tuple.

The system receives a candidate action and an initial environment observation (320). The candidate action can be one of an enumerated set of actions that the vehicle is able to perform in an environment represented by the initial environment observation.

The system can select a candidate action among multiple possible actions using a current state of the reinforcement learning model. In other words, the system can provide the initial environment observation and each of the possible actions to the current reinforcement learning model and receive a respective cumulative action score for each possible action. The system can then select the candidate action having the highest cumulative action score, or select the candidate action using other criteria. For example, the system can select a candidate action that encourages exploration with some measure of randomness, e.g., using an epsilon-greedy selection strategy.

The initial environment observation can include a variety of different data elements, e.g., a route that the vehicle is currently navigating, a road graph of the vehicle's current location, and detected nearby vehicles and other objects, to name just a few examples. For example, the initial environment observation can include a top-down representation of the location of other vehicles and other objects in the environment.

The system uses a vehicle behavior model to compute a predicted environment observation for the candidate action in the initial environment (330). In other words, the system uses the vehicle behavior model to predict a next state of the environment after the vehicle performs the candidate action in the initial environment. The predicted next state of the environment is typically very close in time to the initial environment, e.g., 0.01, 0.1, 0.5, or 1 second later.

The system uses a context-specific quality model to compute an immediate quality value for the candidate action in the initial environment (340). In other words, the system can use the current driving context to obtain a context-specific quality model that was generated for the current driving context.

The system generates an experience tuple using the initial environment observation, the candidate action, and the computed immediate quality value (350).

The system provides the experience tuple as input to a reinforcement learning system for the autonomous vehicle (360). The reinforcement learning system will then use the experience tuple to generate a cumulative action score that represents the long-term expected outcome of performing the candidate action in the initial environment. If the example process is performed during training, the system can then update the reinforcement learning model.

Figure 4:
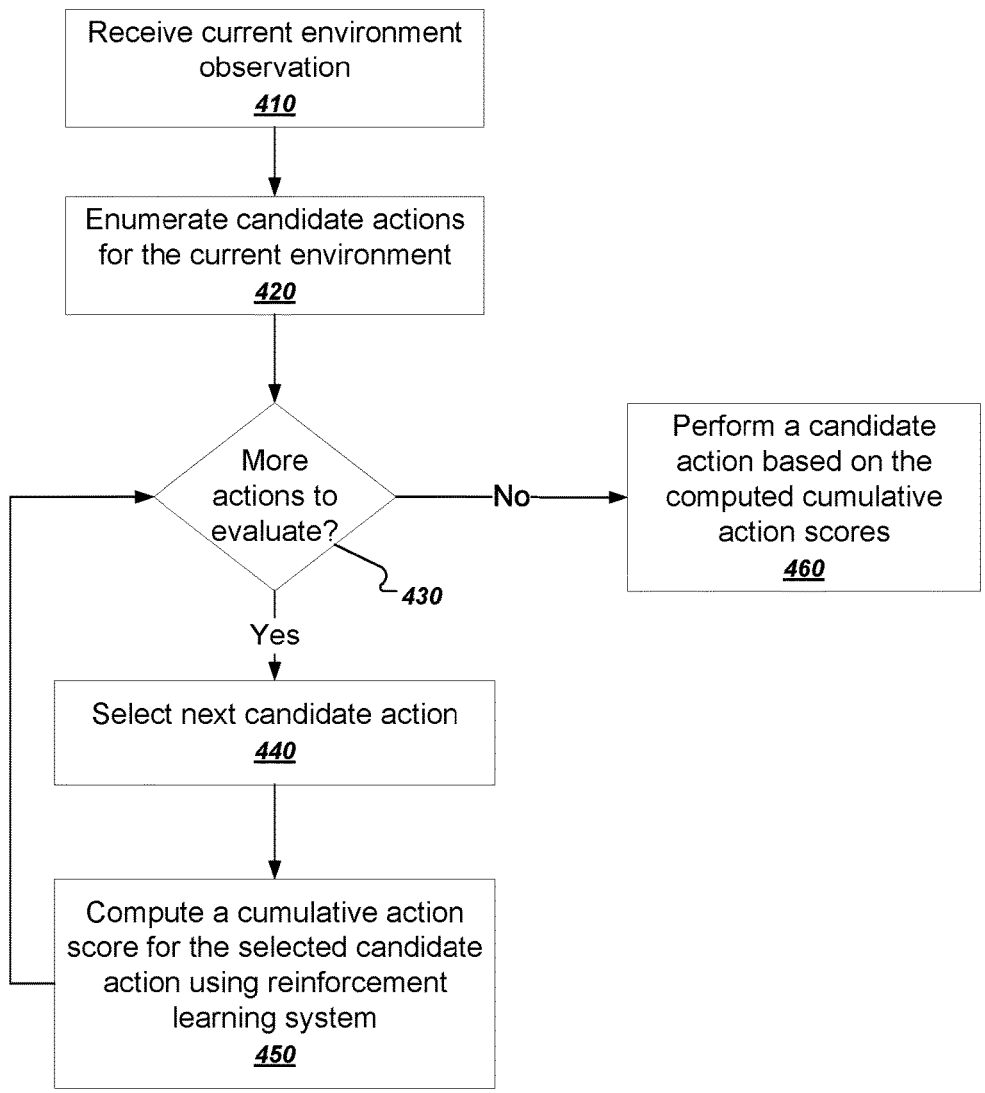
FIG. 4 is a flow chart of an example process for an autonomous vehicle to select an action to perform in a particular environment.

FIG. 4 is a flow chart of an example process for an autonomous vehicle to select an action to perform in a particular environment. For convenience, the example process will be described as being performed by a system of one or more computers. For example, the system 200 of FIG. 2, appropriately programmed in accordance with this specification, can perform the example process.

The system receives a current environment observation (410). For example, the system can use sensor subsystems, e.g., sensor subsystems 120 of FIG. 1, to generate a current environment observation.

The system enumerates candidate actions for the current environment (420). For any given environment, the system can generate and evaluate all possible actions or only actions that are reasonably close to a current state of the vehicle. For example, if the vehicle is currently steering to the left, the system can generate actions having steering options that are in a particular vicinity of the current angle of steering. That is, the vehicle can decline to generate a hard right steering action if it is currently steering to the left. These restrictions can help ensure that the vehicle performs smooth and safe action transitions. As another example, other data of the current environment, e.g., a road graph, can rule out some actions as being illegal or too dangerous. For example, the system need not evaluate a candidate action that steers toward the median of a divided highway.

The system determines whether there are more candidate actions to evaluate (430). If so, the system selects a next candidate action (branch to 440) and computes a cumulative action score for the selected candidate action using a reinforcement learning system (450). For example, the system can use the state value function engine trained using the process described above with reference to FIG. 3 to generate a cumulative action score for a particular environment and candidate action. As part of this process, the system can dynamically select an appropriate driving context, which can be based on the location of the vehicle or other data.

If there are no more actions to evaluate (430), the system performs an action based on the computed cumulative action scores (branch to 460). For example, the system the system can select an action that resulted in the highest cumulative action score. Alternatively, the system can perform additional evaluations of actions having sufficiently high cumulative action scores and select based on those additional evaluations.

For example, the system can initially discard any candidate actions that do not have cumulative action scores that satisfy a threshold. The system can further evaluate the remaining candidate actions based on other factors, e.g., comfort or legality and then select a best candidate action based on the other factors.

Embodiments of the subject matter and the functional operations described in this specification can be implemented in digital electronic circuitry, in tangibly-embodied computer software or firmware, in computer hardware, including the structures disclosed in this specification and their structural equivalents, or in combinations of one or more of them. Embodiments of the subject matter described in this specification can be implemented as one or more computer programs, i.e., one or more modules of computer program instructions encoded on a tangible non-transitory storage medium for execution by, or to control the operation of, data processing apparatus. The computer storage medium can be a machine-readable storage device, a machine-readable storage substrate, a random or serial access memory device, or a combination of one or more of them. Alternatively or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus.

The term "data processing apparatus" refers to data processing hardware and encompasses all kinds of apparatus, devices, and machines for processing data, including by way of example a programmable processor, a computer, or multiple processors or computers. The apparatus can also be, or further include, special purpose logic circuitry, e.g., an FPGA (field programmable gate array) or an ASIC (application-specific integrated circuit). The apparatus can optionally include, in addition to hardware, code that creates an execution environment for computer programs, e.g., code that constitutes processor firmware, a protocol stack, a database management system, an operating system, or a combination of one or more of them.

A computer program which may also be referred to or described as a program, software, a software application, an app, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A computer program can be deployed to be executed on one computer or on multiple computers that are located at one site or distributed across multiple sites and interconnected by a data communication network.

For a system of one or more computers to be configured to perform particular operations or actions means that the system has installed on it software, firmware, hardware, or a combination of them that in operation cause the system to perform the operations or actions. For one or more computer programs to be configured to perform particular operations or actions means that the one or more programs include instructions that, when executed by data processing apparatus, cause the apparatus to perform the operations or actions.

As used in this specification, an "engine," or "software engine," refers to a software implemented input/output system that provides an output that is different from the input. An engine can be an encoded block of functionality, such as a library, a platform, a software development kit ("SDK"), or an object. Each engine can be implemented on any appropriate type of computing device, e.g., servers, mobile phones, tablet computers, notebook computers, music players, e-book readers, laptop or desktop computers, PDAs, smart phones, or other stationary or portable devices, that includes one or more processors and computer readable media. Additionally, two or more of the engines may be implemented on the same computing device, or on different computing devices.

The processes and logic flows described in this specification can be performed by one or more programmable computers executing one or more computer programs to perform functions by operating on input data and generating output. The processes and logic flows can also be performed by special purpose logic circuitry, e.g., an FPGA or an ASIC, or by a combination of special purpose logic circuitry and one or more programmed computers.

Computers suitable for the execution of a computer program can be based on general or special purpose microprocessors or both, or any other kind of central processing unit. Generally, a central processing unit will receive instructions and data from a read-only memory or a random access memory or both. The essential elements of a computer are a central processing unit for performing or executing instructions and one or more memory devices for storing instructions and data. The central processing unit and the memory can be supplemented by, or incorporated in, special purpose logic circuitry. Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device, e.g., a universal serial bus (USB) flash drive, to name just a few.

Computer-readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and pointing device, e.g., a mouse, trackball, or a presence sensitive display or other surface by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's device in response to requests received from the web browser. Also, a computer can interact with a user by sending text messages or other forms of message to a personal device, e.g., a smartphone, running a messaging application, and receiving responsive messages from the user in return.

Embodiments of the subject matter described in this specification can be implemented in a computing system that includes a back-end component, e.g., as a data server, or that includes a middleware component, e.g., an application server, or that includes a front-end component, e.g., a client computer having a graphical user interface, a web browser, or an app through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network (LAN) and a wide area network (WAN), e.g., the Internet.

The computing system can include clients and servers. A client and server are generally remote from each other and typically interact through a communication network. The relationship of client and server arises by virtue of computer programs running on the respective computers and having a client-server relationship to each other. In some embodiments, a server transmits data, e.g., an HTML page, to a user device, e.g., for purposes of displaying data to and receiving user input from a user interacting with the device, which acts as a client. Data generated at the user device, e.g., a result of the user interaction, can be received at the server from the device.

In addition to the embodiments described above, the following embodiments are also innovative:

Embodiment 1 is a method comprising:
receiving a request to generate an experience tuple for a vehicle in a particular driving context, the particular driving context being one of a plurality of driving contexts;
receiving an initial environment observation representing an initial environment of the autonomous vehicle and a candidate action representing an action to be taken by the autonomous vehicle in the initial environment;
generating a predicted environment observation representing a predicted environment of the autonomous vehicle after the candidate action is taken by the autonomous vehicle in the initial environment, including providing the initial environment observation and the candidate action as input to a vehicle behavior model neural network trained to generate predicted environment observations;
generating an immediate quality value including providing the predicted environment of the autonomous vehicle and the candidate action as input to a context-specific quality model that generates immediate quality values that are specific to the particular driving context;
generating an experience tuple comprising the initial environment observation, the candidate action, and the immediate quality value; and
providing the experience tuple as input to a reinforcement learning system for the autonomous vehicle.

Embodiment 2 is the method of embodiment 1, further comprising:
receiving, from the reinforcement learning system, a cumulative action value for the candidate action;
computing updated weights for the reinforcement learning system using the cumulative action value and the immediate quality value; and
updating the reinforcement learning system using the updated weights.

Embodiment 3 is the method of any one of embodiments 1-2, further comprising:
receiving, from the reinforcement learning system, a cumulative action value for the candidate action;
ranking the candidate action with a plurality of other actions according to respective cumulative action values computed by the reinforcement learning system for the actions;
determining that the candidate action is a highest-ranked action; and
in response, selecting the candidate action.

Embodiment 4 is the method of any one of embodiments 1-3, wherein the autonomous vehicle is a physical autonomous vehicle having an onboard policy engine implementing a policy generated by the reinforcement learning system.

Embodiment 5 is the method of any one of embodiments 1-4, wherein the autonomous vehicle is a simulated autonomous vehicle.

Embodiment 6 is the method of any one of embodiments 1-5, wherein the vehicle behavior model neural network generates predicted environment observations for all of the plurality of driving contexts.

Embodiment 7 is the method of embodiment 6, wherein the context-specific quality model is trained using training data from only the particular driving context of the plurality of driving contexts.

Embodiment 8 is the method of embodiment 7, wherein the plurality of driving contexts include one or more of a lane merging context, an intersection navigation context, a lane changing context, or a highway driving context.

Embodiment 9 is the method of any one of embodiments 1, wherein the context-specific quality model uses a collision distance feature representing a sum of actions to be take by the autonomous vehicle and one or more other vehicles to cause a collision.

Embodiment 10 is the method of any one of embodiments 1, wherein the context-specific quality model uses a safety rating feature that quantifies the safety of each particular candidate action and a comfort rating feature that quantifies the passenger comfort of each particular candidate action.

Embodiment 11 is a system comprising: one or more computers and one or more storage devices storing instructions that are operable, when executed by the one or more computers, to cause the one or more computers to perform the method of any one of embodiments 1 to 10.

Embodiment 12 is a computer storage medium encoded with a computer program, the program comprising instructions that are operable, when executed by data processing apparatus, to cause the data processing apparatus to perform the method of any one of embodiments 1 to 10.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In certain some cases, multitasking and parallel processing may be advantageous.

What is claimed is:
1. A computer-implemented method comprising:
receiving a request to generate an experience tuple for a vehicle in a particular driving context, the particular driving context being one of a plurality of driving contexts;
receiving an initial environment observation representing an initial environment of the autonomous vehicle and a candidate action representing an action to be taken by the autonomous vehicle in the initial environment;

generating a predicted environment observation representing a predicted environment of the autonomous vehicle after the candidate action is taken by the autonomous vehicle in the initial environment, including providing the initial environment observation and the candidate action as input to a vehicle behavior model neural network trained to generate predicted environment observations;

generating an immediate quality value including providing the predicted environment of the autonomous vehicle and the candidate action as input to a context-specific quality model that generates immediate quality values that are specific to the particular driving context;

generating an experience tuple comprising the initial environment observation, the candidate action, and the immediate quality value; and providing the experience tuple as input to a reinforcement learning system for the autonomous vehicle.

2. The method of claim 1, further comprising:

receiving, from the reinforcement learning system, a cumulative action value for the candidate action;

computing updated weights for the reinforcement learning system using the cumulative action value and the immediate quality value; and updating the reinforcement learning system using the updated weights.

3. The method of claim 1, further comprising:

receiving, from the reinforcement learning system, a cumulative action value for the candidate action;

ranking the candidate action with a plurality of other actions according to respective cumulative action values computed by the reinforcement learning system for the actions;

determining that the candidate action is a highest-ranked action; and in response, selecting the candidate action.

4. The method of claim 1, wherein the autonomous vehicle is a physical autonomous vehicle having an onboard policy engine implementing a policy generated by the reinforcement learning system.

5. The method of claim 1, wherein the autonomous vehicle is a simulated autonomous vehicle.

6. The method of claim 1, wherein the vehicle behavior model neural network generates predicted environment observations for all of the plurality of driving contexts.

7. The method of claim 6, wherein the context-specific quality model is trained using training data from only the particular driving context of the plurality of driving contexts.

8. The method of claim 7, wherein the plurality of driving contexts include one or more of a lane merging context, an intersection navigation context, a lane changing context, or a highway driving context.

9. The method of claim 1, wherein the context-specific quality model uses a collision distance feature representing a sum of actions to be take by the autonomous vehicle and one or more other vehicles to cause a collision.

10. The method of claim 1, wherein the context-specific quality model uses a safety rating feature that quantifies the safety of each particular candidate action and a comfort rating feature that quantifies the passenger comfort of each particular candidate action.

11. A system comprising:

one or more computers and one or more storage devices storing instructions that are operable, when executed by the one or more computers, to cause the one or more computers to implement:

a vehicle behavior model neural network configured to generate a predicted environment observation representing a predicted environment of an autonomous vehicle in a particular driving context after a candidate action is taken by the autonomous vehicle in an initial environment;

a quality model engine configured to generate an immediate quality value by providing the predicted environment of the autonomous vehicle and the candidate action as input to a context-specific quality model that generates immediate quality values that are specific to the particular driving context; and a reinforcement learning system for the autonomous vehicle that is configured to receive an experience tuple comprising the initial environment observation, the candidate action, and the immediate quality value and to generate a cumulative action value for the candidate action when performed by the autonomous vehicle in the initial environment.

12. The system of claim 11, further comprising:

a training engine configured to receive, from the reinforcement learning system, a cumulative action value for the candidate action, to compute updated weights for the reinforcement learning system using the cumulative action value and the immediate quality value, and to update the reinforcement learning system using the updated weights.

13. The system of claim 11, further comprising:

a policy engine configured to receive, from the reinforcement learning system, a cumulative action value for the candidate action, to rank the candidate action with a plurality of other actions according to respective cumulative action values computed by the reinforcement learning system for the actions, to determine that the candidate action is a highest-ranked action, and to select the candidate action in response.

14. The system of claim 11, further comprising a physical autonomous vehicle having an onboard policy engine implementing a policy generated by the reinforcement learning system.

15. The system of claim 11, wherein the autonomous vehicle is a simulated autonomous vehicle.

16. The system of claim 11, wherein the vehicle behavior model neural network is configured to generate predicted environment observations for all of the plurality of driving contexts.

17. The system of claim 16, wherein the context-specific quality model is trained using training data from only the particular driving context of the plurality of driving contexts.

18. The system of claim 17, wherein the plurality of driving contexts include one or more of a lane merging context, an intersection navigation context, a lane changing context, or a highway driving context.

19. The system of claim 11, wherein the context-specific quality model is configured to use a collision distance feature representing a sum of actions to be take by the autonomous vehicle and one or more other vehicles to cause a collision.

20. The system of claim 11, wherein the context-specific quality model is configured to use a safety rating feature that quantifies the safety of each particular candidate action and a comfort rating feature that quantifies the passenger comfort of each particular candidate action.

21. A computer program product, encoded on one or more non-transitory computer storage media, comprising instructions that when executed by one or more computers cause the one or more computers to perform operations comprising:

receiving a request to generate an experience tuple for a vehicle in a particular driving context, the particular driving context being one of a plurality of driving contexts;

receiving an initial environment observation representing an initial environment of the autonomous vehicle and a candidate action representing an action to be taken by the autonomous vehicle in the initial environment;

generating a predicted environment observation representing a predicted environment of the autonomous vehicle after the candidate action is taken by the autonomous vehicle in the initial environment, including providing the initial environment observation and the candidate action as input to a vehicle behavior model neural network trained to generate predicted environment observations;

generating an immediate quality value including providing the predicted environment of the autonomous vehicle and the candidate action as input to a context-specific quality model that generates immediate quality values that are specific to the particular driving context;

generating an experience tuple comprising the initial environment observation, the candidate action, and the immediate quality value; and providing the experience tuple as input to a reinforcement learning system for the autonomous vehicle.

* * * * *